(12) United States Patent
Senoo (10) Patent No.: US 11,423,998 B2
(45) Date of Patent: Aug. 23, 2022

(54) SEMICONDUCTOR DEVICE AND READING METHOD THEREOF

(71) Applicant: Winbond Electronics Corp., Taichung (TW)

(72) Inventor: Makoto Senoo, Yokohama (JP)

(73) Assignee: WINDBOND ELECTRONICS CORP., Taichung (TW)

(*) Notice: Subject to any disclaimer, the term of this patent is extended or adjusted under 35 U.S.C. 154(b) by 0 days.

(21) Appl. No.: 17/323,699

(22) Filed: May 18, 2021

(65) Prior Publication Data
US 2021/0366561 A1    Nov. 25, 2021

(30) Foreign Application Priority Data

May 22, 2020  (JP) .............................. JP2020-089309

(51) Int. Cl.
| | |
|---|---|
| *G11C 16/34* | (2006.01) |
| *G11C 16/10* | (2006.01) |
| *G11C 16/16* | (2006.01) |
| *G11C 16/30* | (2006.01) |
| *G11C 16/08* | (2006.01) |
| *G11C 16/24* | (2006.01) |
| *G11C 16/28* | (2006.01) |

(52) U.S. Cl.
CPC .......... *G11C 16/3495* (2013.01); *G11C 16/08* (2013.01); *G11C 16/107* (2013.01); *G11C 16/16* (2013.01); *G11C 16/24* (2013.01); *G11C 16/28* (2013.01); *G11C 16/30* (2013.01)

(58) Field of Classification Search
CPC ... G11C 16/3495; G11C 16/08; G11C 16/107; G11C 16/16; G11C 16/24; G11C 16/28; G11C 16/30; G11C 7/14; G11C 16/0483; G11C 16/349; G11C 16/26; G11C 16/3404; G11C 16/14
USPC .................................... 365/185.22, 185.24
See application file for complete search history.

(56) References Cited

U.S. PATENT DOCUMENTS

| | | | |
|---|---|---|---|
| 9,460,795 B2* | 10/2016 | Kwak .................... | G11C 16/10 |
| 9,761,320 B1* | 9/2017 | Chen ...................... | G11C 16/26 |
| 10,783,941 B1* | 9/2020 | Kavalipurapu ........ | G11C 5/147 |

(Continued)

FOREIGN PATENT DOCUMENTS

| | | |
|---|---|---|
| CN | 105895157 A | 8/2016 |
| JP | 6249504 B1 | 12/2017 |
| TW | 334633 B | 6/1998 |

*Primary Examiner* — Michael T Tran
(74) *Attorney, Agent, or Firm* — Birch, Stewart, Kolasch & Birch, LLP (57) ABSTRACT

A flash memory including a NAND memory cell array, a current detection unit, an offset voltage determining unit, and a reading voltage generating unit. The NAND memory cell array forms at least one monitoring NAND string in each block, which are used to monitor the cycle frequency of programing and erasing. The current detection unit detects the current that flows through the monitoring NAND string. The offset voltage determining unit determines the first offset voltage and the second offset voltage that are respectively added to the read-pass voltage and the reading voltage, according to the current detected. The reading voltage generating unit generates the read-pass voltage with the first offset voltage added. The reading voltage generating unit also generates the reading voltage with the second offset voltage added.

20 Claims, 7 Drawing Sheets

(56) References Cited

U.S. PATENT DOCUMENTS

| | | | |
|---|---|---|---|
| 10,902,925 B1* | 1/2021 | Lien | G11C 11/5642 |
| 10,943,664 B2* | 3/2021 | Kwak | G11C 16/08 |
| 2004/0150005 A1* | 8/2004 | Mitoma | G11C 11/4099 |
| | | | 257/200 |
| 2008/0113479 A1* | 5/2008 | Mokhlesi | H01L 27/11521 |
| | | | 438/266 |
| 2009/0010067 A1* | 1/2009 | Lee | G11C 11/5628 |
| | | | 365/185.22 |
| 2010/0002514 A1* | 1/2010 | Lutze | G11C 16/10 |
| | | | 365/185.17 |
| 2010/0124120 A1* | 5/2010 | Park | G11C 16/0483 |
| | | | 365/185.18 |
| 2012/0287716 A1* | 11/2012 | Li | G11C 16/0483 |
| | | | 365/185.17 |
| 2013/0250698 A1* | 9/2013 | Kim | G11C 16/24 |
| | | | 365/185.25 |
| 2013/0272067 A1* | 10/2013 | Lee | G11C 16/10 |
| | | | 365/185.11 |
| 2014/0198568 A1 | 7/2014 | Tran et al. | |
| 2016/0078954 A1* | 3/2016 | Shirakawa | G11C 16/3459 |
| | | | 365/185.11 |
| 2016/0307638 A1* | 10/2016 | Shirakawa | G11C 11/5628 |
| 2017/0140814 A1* | 5/2017 | Puthenthermadam | |
| | | | G11C 16/08 |
| 2017/0278579 A1* | 9/2017 | Lee | G11C 16/3459 |
| 2019/0318784 A1* | 10/2019 | Lee | G11C 16/10 |
| 2020/0395075 A1* | 12/2020 | Joo | G11C 16/24 |
| 2021/0020254 A1* | 1/2021 | Kim | G11C 16/10 |
| 2021/0118518 A1* | 4/2021 | Wu | G11C 29/38 |
| 2022/0148665 A1* | 5/2022 | Gautam | G11C 16/30 |

* cited by examiner

SEMICONDUCTOR DEVICE AND READING METHOD THEREOF

CROSS REFERENCE TO RELATED APPLICATIONS

This application claims priority of Japanese Patent Application No. 2020-089309, filed on May 22, 2020, the entirety of which is incorporated by reference herein.

BACKGROUND OF THE INVENTION

Field of the Invention

The present disclosure relates to semiconductor storage devices such as NAND Flash Memory, and, in particular, to reading method of a memory cell array.

Description of the Related Art

Figure 1A:
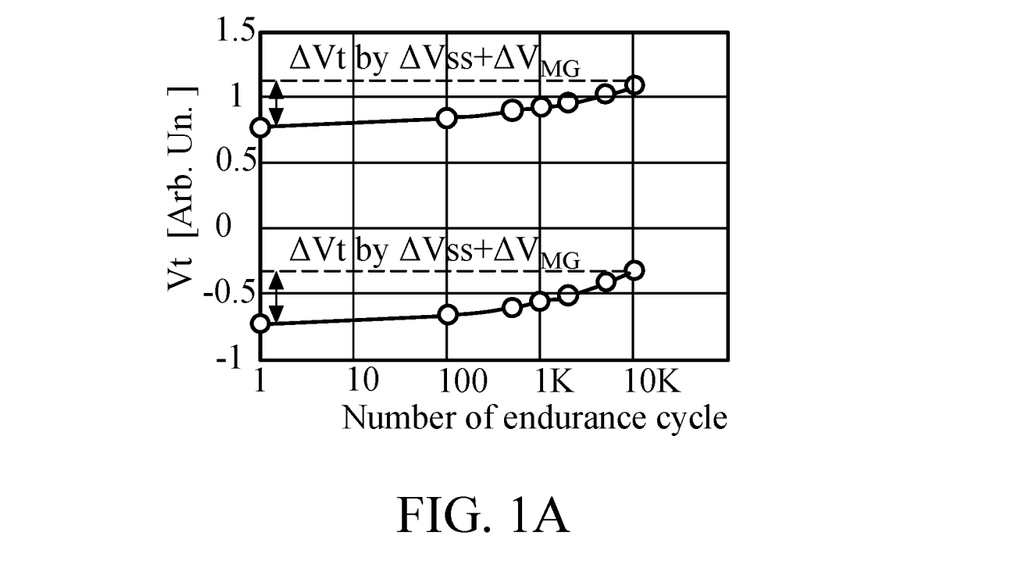
FIG. 1A shows the relationship between the number of iterations of data rewriting (the number of programs/erase cycles) of a NAND flash memory, and the threshold value of a memory cell.

As the memory cell becomes smaller, the endurance characteristics and data retention characteristics of the flash memory deteriorate significantly (Patent document 1, Non-patent document 1). FIG. 1A shows the characteristics of program/erase cycles, wherein the vertical axis represents the threshold value of the memory cell, and the horizontal axis represents the number of program/erase cycles. It is clear from the figure that although the threshold value Vt of program/erase memory cells hardly changes until 10-1000 cycles, the threshold value Vt gradually shifts in the positive direction while exceeding around a thousand cycles. One of the suspected reasons for this is that electrons are being trapped in the gate oxide layer. Another suspected reason is that the gate oxide layer deteriorates due to electrons tunneling as the number of program/erase cycles increases.

RELATED ART DOCUMENTATION

Patent Documentation

<Patent Documentation 1> JP6249504B1
<Non-patent Documentation 1> The new program/Erase Cycling Degradation Mechanism of NAND Flash Memory Devices, Albert Fayrushin, et al. Flash Core Technology Lab, Samsung Electronics Co, Ltd, IEDM09-823, P34.2.1-2.4

BRIEF SUMMARY

Figure 1B:
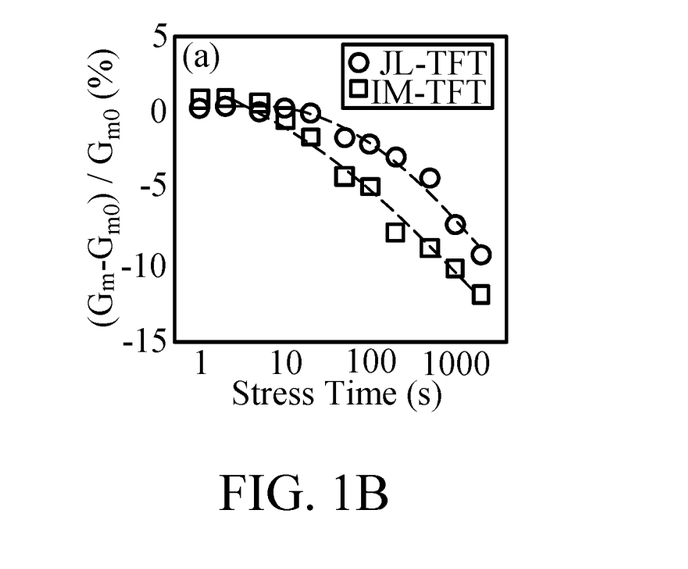
FIG. 1B shows the relationship between the stress of a transistor and Gm.

As described above, when the number of program/erase cycles increases, the gate insulating layer and the like deteriorate, and the threshold value Vt of the memory cell shifts. Moreover, FIG. 1B shows the relationship between the stress times (the number of times experiencing stress) of a transistor and Gm (transconductance). (JL is a junctionless TFT transistor, and IM is an inversion mode TFT transistor.) (Junctionless Nanosheet (3 nm) Poly-Si TFT: Electrical Characteristics and Superior Positive Gate Bias Stress Reliability, Jer-Yi Lin, Malkundi Puttaveerappa Vijay Kumar, Tien-Sheng Chao, Published in IEEE Electron Device Letters 2018, Chemistry.) It is clear from the figure that Gm decreases as the number of stress times of the gate of the transistor increases. The stress to the gate of the transistor is equivalent to the programing/erasing of memory cells, therefore, as the number of program/erase cycles increases, the Gm (transconductance) of a memory cell decreases. Due to various phenomena, such as threshold Vt shifting or Gm deterioration, there is a possibility that the data in the memory cell cannot be read correctly. For example, when optimizing the reading voltage VREAD for fresh memory cells with few or no program/erase cycles, the threshold value Vt of memory cells with more program/erase cycles shifts in the positive direction and the difference between the threshold value Vt of memory cells in programing state becomes smaller, which means that memory cells in the erasing state are likely being misread as memory cells in a programing state. Furthermore, due to the deterioration of Gm of the memory cell, the magnitude of current obtained is reduced in the memory cell having a large number of program/erase cycles, even if the increment of the gate voltage with respect to the threshold value Vt is the same. As a result, the desired current may not be obtained during the discharge period tDIS, and the same misreading may occur.

Figure 2:
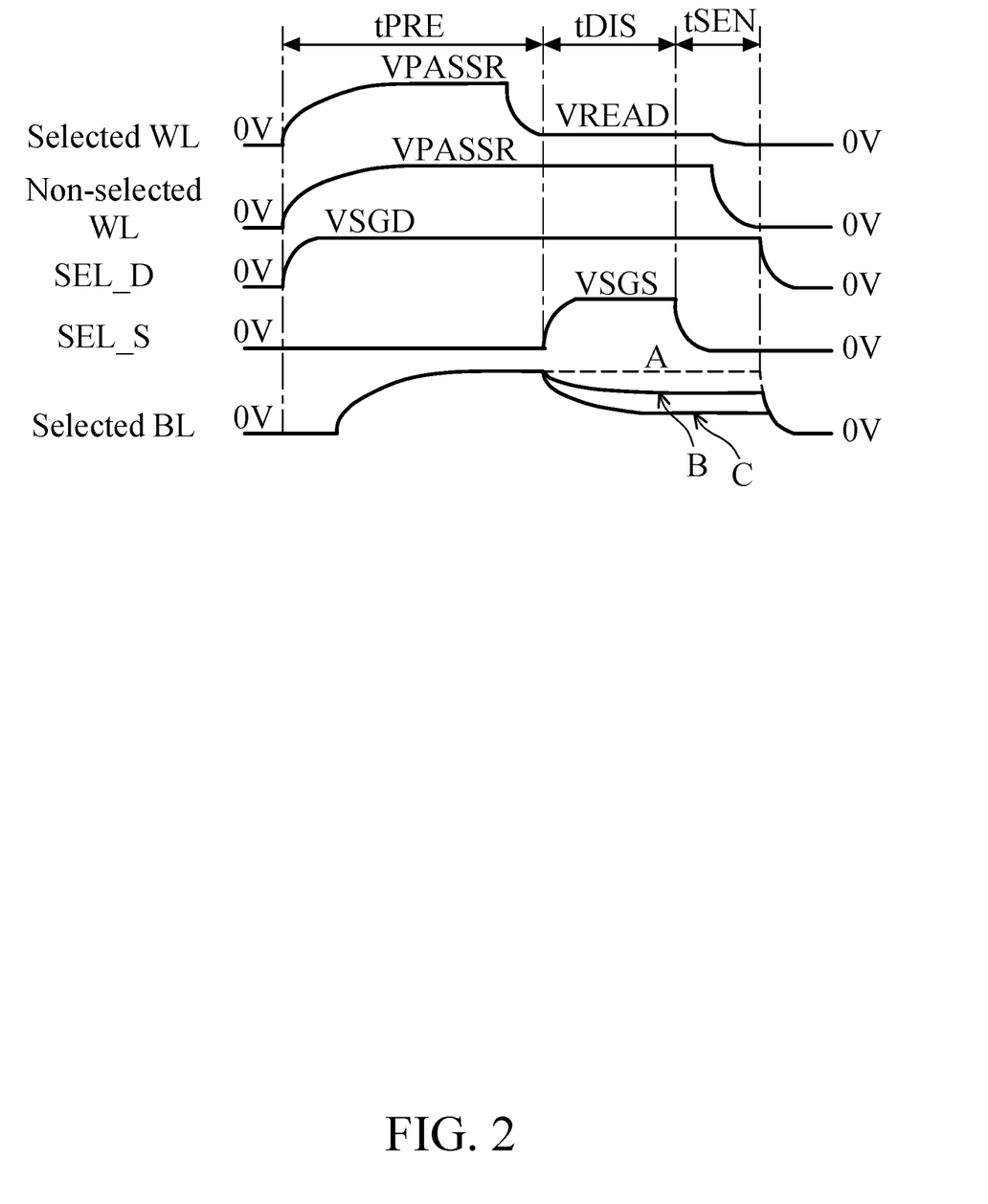
FIG. 2 shows a timing chart explaining the read operation of the conventional flash memory.

FIG. 2 is a timing chart of the read operation of a conventional NAND flash memory. During the precharge period tPRE, read-pass voltage VPASSR (voltage that is high enough to turn on the programmed memory cell) is applied to selected word lines and non-selected word lines. Moreover, the select transistors SEL_D on the bit line side are turned on by the gate voltage VSGD; the select transistors SEL_S on the source line side are turned off by the gate voltage 0V; and bit lines and NAND strings in the selected block are precharged by voltages. Next, during the discharge period tDIS, reading voltage VREAD (for example, 0.2V) is applied to selected word lines. Also, the selected transistors SEL_S on the source line side are turned on by the gate voltage VSGS. When the selected memory cell is in the programming state, the electric potential of bit lines do not change because the NAND strings are not conductive but when the selected memory cell is in the erasing state, the NAND strings are conducted, and so the electric potential of the bit lines decreases. Next, in the sensing period tSEN, a determination is made as to whether the selected memory cells are in the programing state (data "0") or the erasing state (data "1"). This determination is accomplished by the page buffering/sensing circuit that detects the electric potential of the clamped bit lines.

The broken line A shows the electric potential of the bit lines when the selected memory cells are programmed. Solid lines B and C show the electric potential of the bit lines when the memory cells are erased. Solid line B illustrates cases where the number of program/erase cycles is large. Solid line C illustrates cases where the number of program/erase cycles is small.

As described above, if the number of program/erase cycles increases, the threshold value Vt will shift in the positive direction, and sufficient current cannot flow through memory cells in the discharge period tDIS due to the deterioration of Gm. As shown by solid line B, the potential of bit lines does not decrease sufficiently, and the difference from the potential of the bit lines of the programmed memory cells (broken line A) becomes smaller. That is, the reading margin becomes smaller, and chances are that the memory cells in an erasing state are being mistakenly determined as memory cells in a programing state.

The purpose of the present disclosure is to solve such problems with the conventional technology, and to provide a semiconductor memory device that can compensate for the shifting of the threshold value Vt or the deterioration of Gm, and a reading method thereof.

A reading method of a semiconductor memory device according to the present disclosure comprises the following steps. In the first step, at least one monitoring NAND string for each of the blocks in a NAND memory cell array is prepared. The monitoring NAND string is used to monitor the cycle frequency of programming and erasing. In the second step, the current that flows through the monitoring NAND string is detected. In the third step, a first offset voltage and a second offset voltage that are respectively added to a read-pass voltage and a reading voltage are determined according to the detected current. In the fourth step, when the cell memory array is being read, a read-pass voltage is applied where the first offset voltage is added to non-selected word lines, and a reading voltage is applied where the second offset voltage is added to selected word lines.

A semiconductor memory device according to the present disclosure comprises a NAND memory cell array, a current detecting device, a determining device, and a reading device. The NAND memory cell array comprises a plurality of blocks, each of which is formed with at least one monitoring NAND string to monitor the cycle frequency of programing and erasing. The current detecting device detects the current that flows through the monitoring NAND string. The determining device determines the first offset voltage and the second offset voltage that are respectively added to the read-pass voltage and the reading voltage, based on the current detected by the current detecting device. The reading device reads the page of the memory cell array. The reading device applies a read-pass voltage where the first offset voltage is added to non-selected word lines. The reading device also applies a reading voltage where the second offset voltage is added to selected word lines.

According to the present disclosure, the shifting of the threshold value Vt of the memory cell or the deterioration of Gm can be compensated for by detecting the current of the monitoring NAND string which is used for monitoring the cycle frequency of programming and erasing, and adding an offset voltage according to the read-pass voltage and the reading voltage. As a result, the data stored in the memory cell can be read correctly.

BRIEF DESCRIPTION OF THE DRAWINGS

The present disclosure can be more fully understood by reading the subsequent detailed description and examples with references made to the accompanying drawings, wherein.

DETAILED DESCRIPTION

Next, an embodiment of the present disclosure will be described in detail with reference to the drawings. The semiconductor memory device according to the present disclosure, for example, can be such as a NAND flash memory, or a microprocessor, a microcontroller, a logic, an ASIC, a processor that processes images and sounds, a processor that processes signals such as wireless signals, and the like that embeds such a flash memory.

Figure 3:
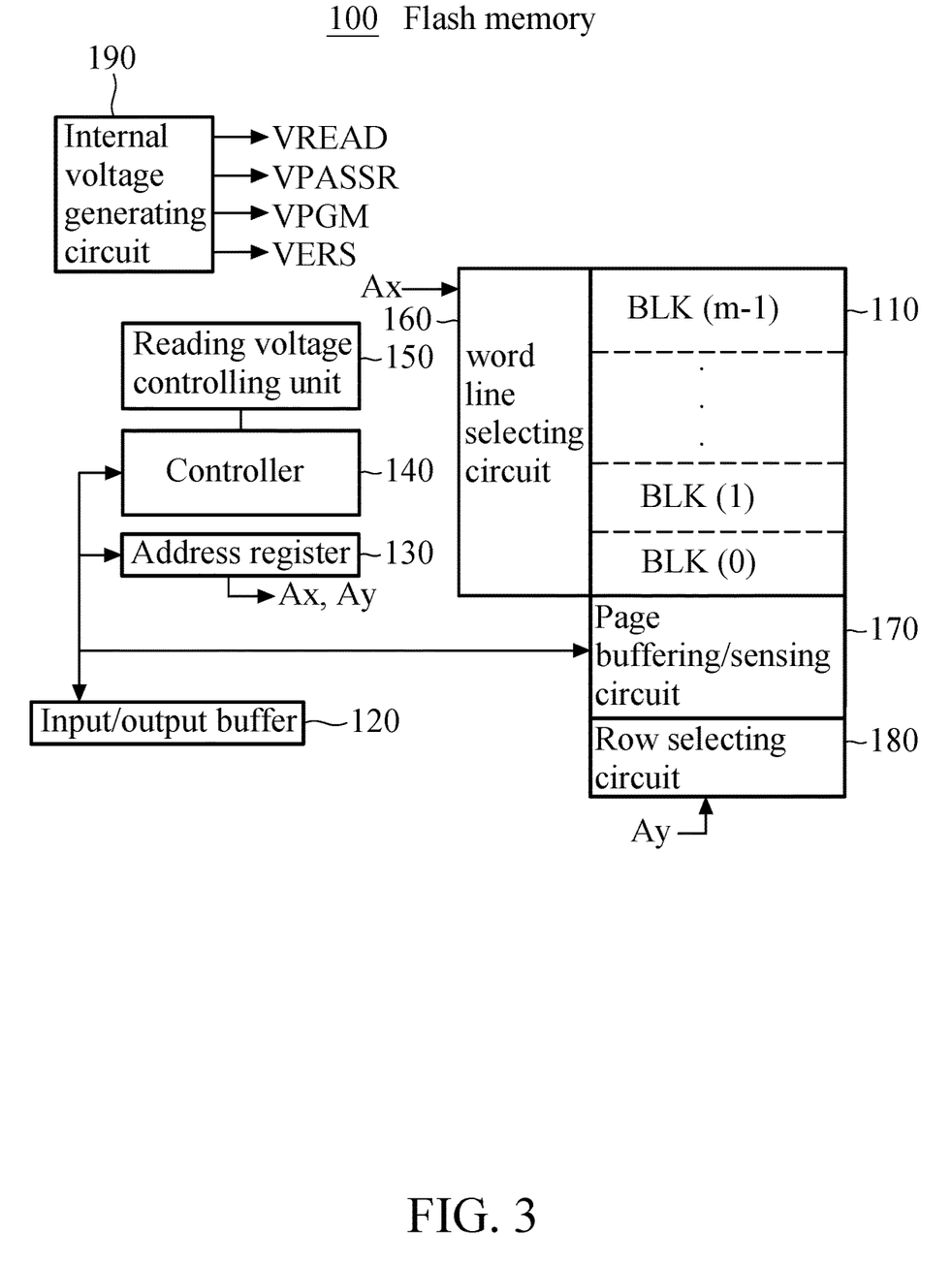
FIG. 3 shows a block diagram of the structure of the flash memory according to an embodiment of the present disclosure.

FIG. 3 is a diagram showing an internal configuration of a NAND flash memory according to an embodiment of the present disclosure. According to this embodiment, the flash memory 100 comprises a memory array 110 having a plurality of memory cells arranged in a matrix; an input/output buffer 120 to input/output data and so on, an address register 130, holding an address received via the input/output buffer 120; a controller 140 controlling each part based on a command or the like received via the input/output buffer 120; a reading voltage controlling unit 150, controlling a reading voltage and a read-pass voltage applied to selected word lines and non-selected word lines during the read operation; a word line selecting circuit 160, selecting blocks or word lines based on the decoding result of the column address Ax from the address register 130; a page buffering/sensing circuit 170, holding the data read from the page selected by the word line selecting circuit 160 or the data to be programmed to the selected page; a row selecting circuit 180, selecting rows in the page buffering/sensing circuit 170 based on the decoding result of the row address Ay from the address register 130; and an internal voltage generating circuit 190, generating various voltages (reading voltage VREAD, read-pass voltage VPASSR, program voltage VPGM, erase voltage VERS, etc.) required for reading, programming, erasing, and so on.

Figure 4A:
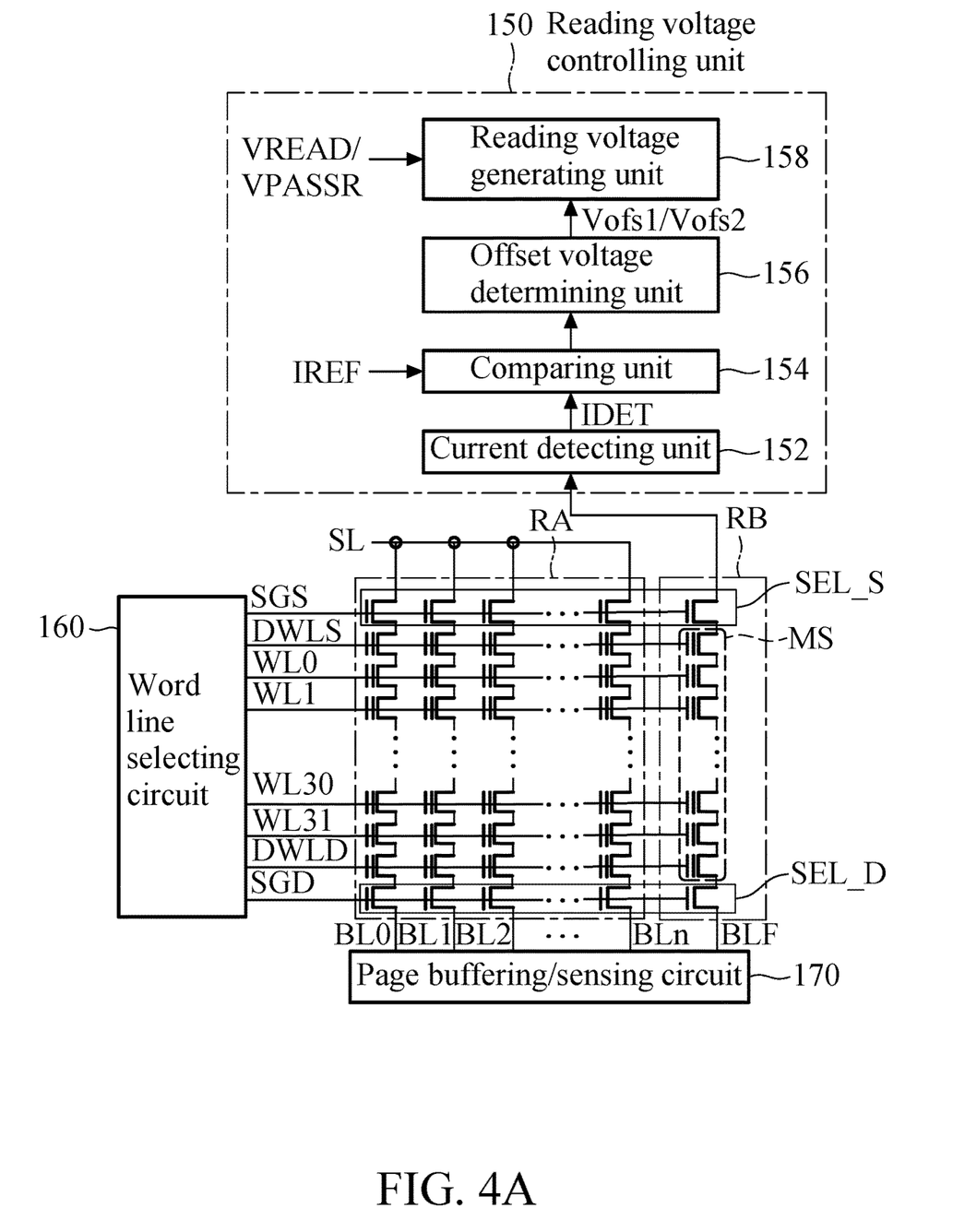
FIG. 4A shows an example structure of the monitoring NAND string and the reading voltage controlling unit according to an embodiment of the present disclosure.

The memory cell array 110 includes m plurality of blocks BLK (0), BLK (1), ..., BLK (m−1). As shown in FIG. 4, one block is formed by a page of NAND strings formed in the user area RA that can be used by the user (or can be accessed by the user), and at least one monitoring NAND string MS formed in the non-user area that cannot be used by the user (or cannot be accessed by the user). The NAND string formed in the user area RA includes: a source line side selection transistor SEL_S having a gate connected to the selection gate line SGS; a source line side dummy memory cell having a gate connected to the dummy word line DWLS; 32 memory cells having gates connected to word lines WL0, WL1, ... WL31 respectively; a bit line side dummy memory cell having a gate connected to the dummy word line DWLD; and a bit line side selection transistor SEL_D having a gate connected to the selection gate line SGD. Dummy memory cells at the source line side or the bit line side can be in either an erasing state or a programing state. These NAND strings are connected with the page buffering/sensing circuit 170 by the bit lines BL0, BL1, BL2, ... BLn.

The monitoring NAND string MS formed in the non-user area RB is configured in the same manner as the NAND string formed in the user area RA. The monitoring NAND string MS is connected to the page buffering/sensing circuit 170 via the bit line BLF. The monitoring NAND string MS is prepared to monitor the number of program/erase cycles of the block or the cycle frequency of the block. In one embodiment, the two dummy memory cells and the 32 memory cells included in the monitoring NAND string MS are programmed consecutively after the block is erased. Programming the monitoring NAND string performs dump programming to the two dummy memory cells and the 32 memory cells all at once (details will be described later). In addition, programming the monitoring NAND string MS uses a weaker programming than that for programming the memory cells of the user area RA. This is to restrain the program time from becoming long by omitting the suppression on overwriting of the monitoring NAND string MS and omitting the program verification; or to restrain the erasing time of the entire block from becoming long by omitting the erasing verification of the monitoring NAND string MS, and at the same time, suppress the over-erasing of the NAND string in the user area RA during the subsequent erase operation. For example, the number of programming pulses applied to the memory cell of the monitoring NAND string MS is limited to a number (e.g., 1) that is less than programming the user area RA. Alternatively, the programming voltage applied to the memory cell of the monitoring NAND string MS is limited to lower than the voltage for programming the user area RA. Alternatively, the voltage applied to the bit lines of the monitoring NAND string MS is between the programming voltage and the non-programming voltage. However, when the threshold value of the programming state of the memory cell of the monitoring NAND string MS is managed accurately, the program verification may be performed. At that time, the voltage of the selected word line of the program verification may be set in low to restrain overwriting. In this way, the characteristics such as Gm (transconductance) of the memory cell of the monitoring NAND string MS generally reflects the number of program/erase cycles or cycle frequency of the NAND string of the user area RA of the block by programming the monitoring NAND string MS of the block each time the block is erased.

In other embodiments, the monitoring NAND string MS is programmed at the same time as the programming of the selected page of the memory cell array. For example, when the page of the word line WL0 is programmed, the memory cells of the word line WL0 of the monitoring NAND string MS are programmed at the same time (data "0"). As a result, the characteristics such as Gm of the memory cell of the monitoring NAND string MS generally reflect the number of program/erase cycles of the memory cell on the same page of the user area RA.

Besides, the memory cell array 110 may be formed two-dimensionally on the surface of the substrate, or may be formed three-dimensionally in the direction perpendicular to the surface of the substrate. Furthermore, the memory cell may be the SLC type that stores one bit (binary data) or may be a type that stores multiple bits.

The controller 140 includes a state machine or a microcontroller, controlling each operation of the flash memory. In the read operation, a certain positive voltage is applied to the bit line, a reading voltage VREAD is applied to the selected word line, a read-pass voltage VPASSR is applied to the non-selected word line, the selected transistors at bit line side and the selected transistors at the source line side are turned on, and 0V is applied to the source line. In the program operation, a high voltage programming voltage VPGM is applied to the selected word line, an intermediate potential is applied to the non-selected word line, the selected transistor at the bit line side is turned on, the selection transistor at the source line side is turned off, and a potential is supplied to the bit line according to whether the data is "0" or "1". In the erase operation, 0V is applied to all the selected word lines in the block, a high voltage erasing voltage VERS is applied to the P well, the electrons of the floating gate are drawn out to the substrate, and the data is erased in units of blocks.

As described above, when erasing the selected block, the controller 140 programs the monitoring NAND string MS after the erase operation. In the erase operation, 0V is applied to all word lines in the selected block, an erasing pulse is applied to the P-well region, and an erasing verification is performed. After that, the monitoring NAND string MS is programmed. In some embodiment, the monitoring NAND string MS is dump programmed. That is, a programming voltage is applied to the dummy word line DWLS/DWLD of the selected block and all word lines, a program voltage (for example, 0V) is applied to the bit line BLF of the monitoring NAND string MS, a program prohibition voltage is applied to each bit line of the user area RA, and all of the memory cells of the monitoring NAND string MS are programmed at once. By programming the NAND string MS at one time, the time required to restrain the erasing of the selected block becomes longer. However, if there is a margin in the erase time of the selected block, it is not prohibited to program the monitoring NAND string MS page by page from the source line side of the monitoring NAND string MS.

In this embodiment, when the controller 140 performs a read operation (including program verification), the controller 140 applies the reading voltage VREAD and the read-pass voltage VPASSR controlled by the reading voltage controlling unit 150 to the selected word line and the non-selected word line. In one embodiment, the reading voltage controlling unit 150 detects the current flowing through the monitoring NAND string MS during the pre-charge period of the read operation under the control of the controller 140, and determines the offset voltage to be added to the reading voltage VREAD and the read-pass voltage VPASSR according to the difference between the detected current and the reference current. As the number of program/erase cycles increases, the Gm (transconductance) of the memory cell decreases, and the current flowing through the memory cell decreases. The current flowing through the memory cell of the monitoring NAND string reflects the number of program/erase cycles or the cycle frequency of the block. The reference current is the current flowing through a memory cell in a fresh erase state in which the number of program/erase cycles is small or has not been cycled.

Figure 4B:
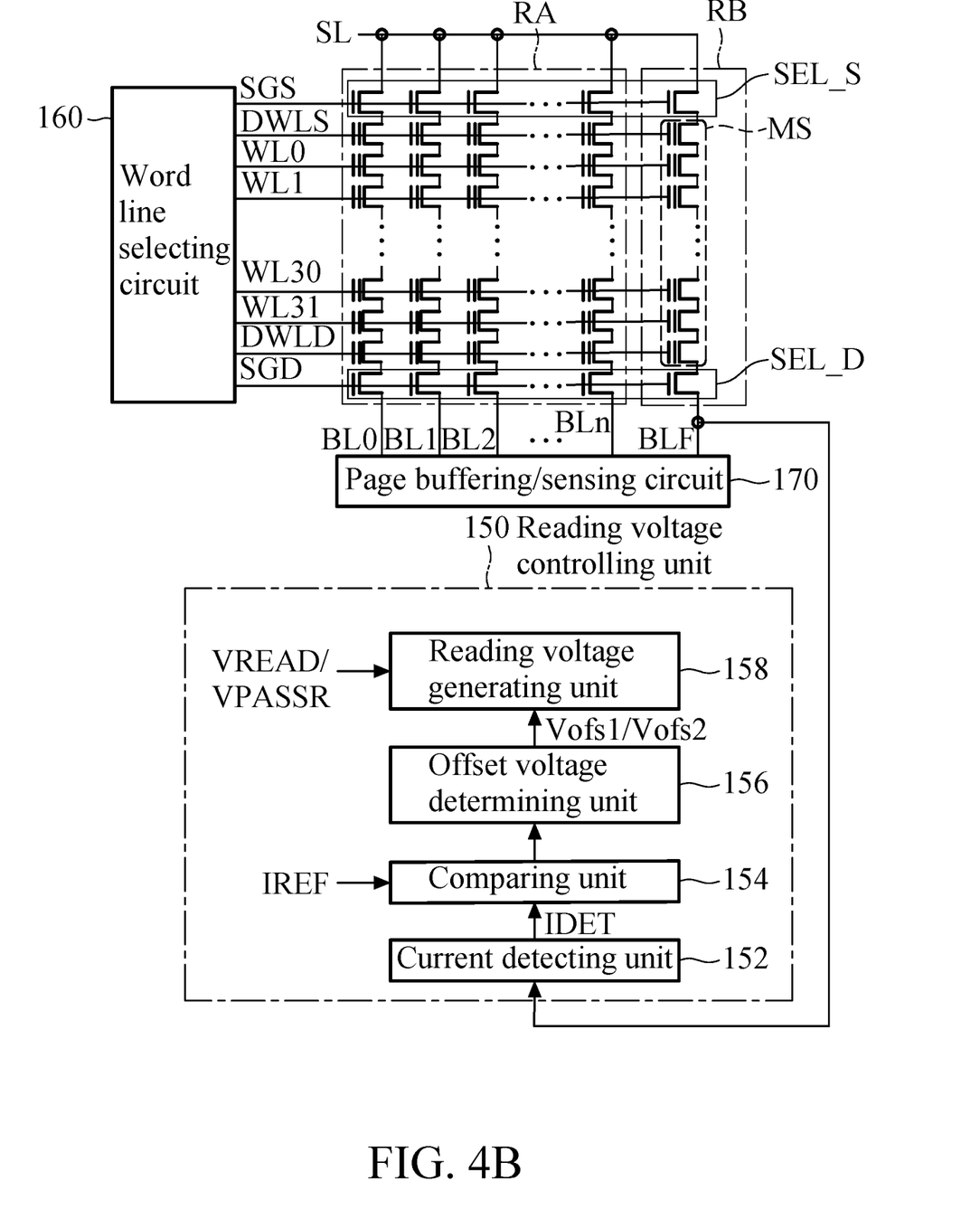
FIG. 4B shows another structure of the monitoring NAND string and the reading voltage controlling unit according to an embodiment of the present disclosure.

As shown in FIG. 4A, the reading voltage controlling unit 150 is connected to the monitoring NAND string MS at the source line side. This comprises a current detecting unit 152, a comparing unit 154, an offset voltage determining unit 156, and a reading voltage generating unit 158. The current detecting unit 152 detects the current IDET flowing through the monitoring NAND string. The comparing unit 154 compares the detected current IDEF with the reference current IREF. The offset voltage determining unit 156 determines the offset voltage Vofs1/Vofs2 according to the comparing result. The reading voltage generating unit 158 generates a read-pass voltage VPASSR+Vofs1 and a reading voltage VREAD+Vofs2 according to the offset voltages Vofs1/Vofs2 as determined by the offset voltage determining unit 156. In another embodiment, for example, the reading voltage controlling unit 150 may be connected to the bit line side of the monitoring NAND string, as shown in FIG. 4B. The reading voltage controlling unit 150 comprises hardware and/or software.

When the current detecting unit 152 is detecting the current of the monitoring NAND string MS, the selected transistor SEL_D at the bit line side and the selected transistor SEL_S at the source line side are conductive, a read-pass voltage VPASSR is applied to the dummy word line DWLS/DWLD and all word lines, and all memory cells are conductive. Furthermore, a voltage is applied to the bit line BLF connected to the monitoring NAND string MS. This voltage may be the precharge voltage applied by the page buffering/sensing circuit 170 during the read operation, for example. In this way, current flows from the bit line side to the source line side of the monitoring NAND string MS. Using the configuration shown in FIG. 4A, the current flowing from the bit line BLF is detected by the current detection unit 152. Using the configuration shown in FIG. 4B, the current flowing out toward the source line is detected by the current detection unit 152.

The comparing unit 154 compares the current IDET detected by the current detecting unit 152 with the reference current IREF prepared in advance. For example, when applying a voltage that is equal to the applied voltage while detecting the current of the monitoring NAND string MS, the reference current IREF is the current that flows through a fresh NAND string that is in the erased state and that has not undergone a program/erase cycle. The comparison unit 154 calculates the difference between the detected current IDET and the reference current IREF, and provides the difference to the offset voltage determining unit 156. The difference may be information indicating whether IDET<IREF, or it may be information indicating the magnitude of the difference of IREF-IDET.

There are options for the method used for generating the reference current IREF. The method may involve, for example, generating a reference current IREF by using a replica (dummy) of a fresh NAND string, or generating a reference current IREF by using an unused NAND string in the memory cell array, or generating a reference current IREF by using a current source circuit, a resistor, a transistor, or the like. Furthermore, the reference current IREF may be adjusted according to an instruction from the controller 140. For example, the reference current IREF may be adjusted based on the trimming data for compensating for the manufacturing variation.

The offset voltage determining unit 156 determines the offset voltage Vofs1/Vofs2 based on the comparison result of the comparison unit 154. The offset voltage Vofs1 is a voltage added to the read-pass voltage VPASSR applied to the non-selected word line during the discharge period (a part of the sensing period may be included). The offset voltage Vofs2 is a voltage added to the reading voltage VREAD applied to the selected word line during the discharge period (a part of the sensing period may be included).

In one embodiment, the offset voltage determining unit 156 determines a predetermined offset voltage Vofs1/Vofs2 when IDET<IREF is detected by the comparing unit 154. For example, a circuit that generates an offset voltage may be enabled in response to the detection of IDET<IREF (or IREF−IDET>constant value).

In another embodiment, when the difference of IREF-IDET is detected by the comparison unit 154, the offset voltage determination unit 156 determines the offset voltage Vofs1/Vofs2 according to the difference. One option for this method would, for example, be to prepare a lookup table that defines the relationship between the magnitude of the difference and the offset voltage Vofs1/Vofs2, and for the offset voltage determining unit 156 to refer to this table to determine the offset voltage Vofs1/Vofs2. If the difference from the comparing unit 154 is a digital signal, the offset voltage determining unit 156 determines the offset voltage Vofs1/Vofs2 according to the digital signal. If the difference from the comparing unit 154 is an analog signal, the offset voltage determining unit 156 may A/D convert the analog signal into a digital signal to determine the offset voltages Vofs1/Vofs2.

The reading voltage generating unit 158 adds the offset voltages Vofs1/Vofs2 determined by the offset voltage determining unit 156 to the read-pass voltage VPASSR and the reading voltage VREAD received from the internal voltage generating circuit 190 during the read operation, generates the read-pass voltage VPASSR+Vofs1 and the reading voltage VREAD+Vofs2. When the difference between the detected current IDET and the reference current IREF is less than a certain value, the offset voltages Vofs1 and Vofs2 may be zero.

Figure 5:
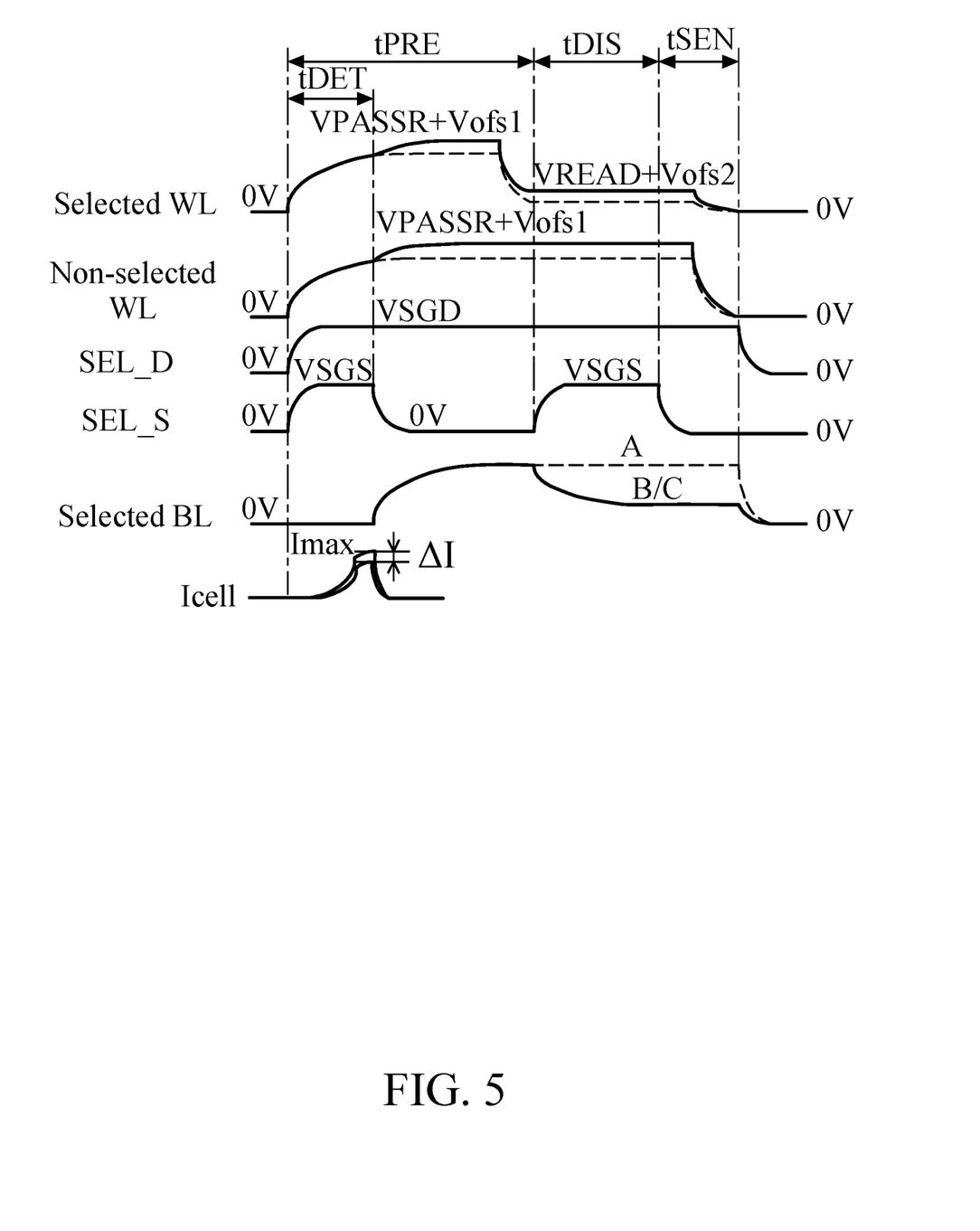
FIG. 5 shows a timing chart explaining the read operation of the flash memory according to an example of the present disclosure.

Next, the read operation of the flash memory of this embodiment will be described with reference to the timing chart of FIG. 5. When the controller 140 receives the read command and the address from the host device via the input/output buffer 120, the controller 140 starts the read operation.

The precharge period tPRE includes the current detection period tDET, and the current flowing through the monitoring NAND string MS is detected in parallel with the precharge of the bit line. First, the current of the NAND string MS is detected. The word line selecting circuit 160 applies a read-pass voltage VPASSR to the selected word line and the non-selected word line. The read-pass voltage VPASSR is a voltage that makes the memory cell conductive regardless of the program of the memory cell, and is, for example, about 6.0 V. The word line selecting circuit 160 further applies a gate voltage VSGD to conduct the selected transistor SEL_D at the bit line side, and also applies a gate voltage VSGS having a certain pulse width to turn on the selected transistor SEL_S at the source line side for a certain period of time.

In this way, the page buffering/sensing circuit 170 applies a precharge voltage to the bit lines BL0, BL1, . . . , BLn, and BLF during the period that the monitoring NAND string MS enters the conductive state from the bit line side to the source line side. However, if possible, the precharge voltage may be applied only to the bit line BLF connected to the monitoring NAND string MS during the current detection period tDET. In this way, current flows through the monitoring NAND string MS, and this current is detected by the current detecting unit 152. The current Icell flowing through the memory cell of the monitoring NAND string MS decreases by ΔI from the current Imax that is the current when the NAND string is fresh, based on the number of program/erase cycles. In this way, during the current detection period tDET, the reading voltage generating unit 158 generates the read-pass voltage VPASSR+Vofs1 and the reading voltage VREAD+Vofs2 based on the difference between the detected current IDET and the reference current IREF.

When the current detection period tDET ends, the word line selecting circuit 160 sets the gate voltage of the selected transistor SEL_S at the source line side to 0V and sets the selected transistor SEL_S at the source line side to be non-conducting. Furthermore, the word line selecting circuit 160 applies the read-pass voltage VPASSR+Vofs1 generated by the reading voltage generating unit 158 to the selected word line and the non-selected word line. This is a voltage only higher by the offset voltage Vofs1 as compared with the conventional read-pass voltage VPASSR. As a result, the deterioration of Gm of the memory cell of the user area RA of the block is compensated for by the offset voltage Vofs1, restraining the precharge voltage of the bit line and the NAND string from being lower than the expected voltage.

After precharging, the bit line and NAND string are discharged. In the discharge period tDIS, the word line selecting circuit 160 applies the reading voltage VREAD+ Vofs2 generated by the reading voltage generating unit 158 to the selected word line, and applies the gate voltage VSGS to the selection transistor SEL_S at the source line side to make the selection transistor SEL_S at the source line side turned-on. As a result, the NAND string in which the selected memory cell is in the programmed state remains the precharge voltage (indicated by the broken line A), and the NAND string in which the selected memory cell is in the erased state discharges the precharge voltage to the source line SL. The solid line B shows the discharge potential of the NAND string and the bit line having a large number of program/erase cycles, and the solid line C shows the discharge potential of the NAND string and the bit line having a small number of program/erase cycles or no cycle.

In this embodiment, by applying the reading voltage VREAD+Vofs2 to the selected word line, a large amount of current can flow through as the offset voltage Vofs2 increases even in the memory cell in the erased state having a large number of program/erase cycles. As a result, the deterioration of Gm of the memory cell can be compensated for, and the discharge potential of the solid line B can be set to the same level as the discharge potential of the solid line C.

Next, in the sensing period tSEN, the page buffering/sensing circuit 170 senses the potential of the bit line, and determines whether the selected memory cell is in the program state (data "0") or the erase state (data "1"). Since the difference of read margin between the potential of the bit line including the programmed memory cell (broken line A) and the potential of the bit line including the memory cell in the erased state (solid line B/C) is sufficiently secured, it is possible to prevent a memory cell in the erased state from being mistakenly determined as a memory cell in the program state.

The above embodiment shows an example in which the current of the monitoring NAND string MS is detected during the precharge period of the read operation, but the timing of detecting the current is not limited to this and may be performed at other times. For example, it may be executed when the power of the flash memory is turned on, when the block is erased, when the page is programmed, and the like. In this case, the current detection unit 152 holds the data related to the detected current in registers or the like, and determines the offset voltages Vofs1 and Vofs2 based on the data read from the registers when the read operation is performed.

In the above embodiment, the read operation for the page of the memory cell array has been illustrated, but the reading method of this embodiment can be similarly applied to the reading of the program verify during the program operation.

In the above embodiment, the offset voltage Vofs1/Vofs2 is determined by comparing the detection current IDET of the monitoring NAND string with the reference current IREF, but the offset voltage is not limited to this, and comparison with the reference current is not always necessary. For example, a table that defines the relationship between the magnitude of the detected current IDET and the offset voltage Vofs1/Vofs2 may be prepared in advance, and the offset voltage Vofs1/Vofs2 may be determined with reference to the table.

Although the above embodiment prepares one monitoring NAND string, preparing a plurality of monitoring NAND strings is also preferable. For example, all memory cells of a part of the monitoring NAND strings is programmed when the block is erased, and the other parts of the monitoring NAND strings program the memory cell corresponding to the page when programming the selected page while the number of programming of data "0" exceeds half. The program of all memory cells of one part of monitoring NAND strings assume the worst case of the deterioration of the memory cell regardless of the data to be programmed. On the other hand, the programs for the other parts of monitoring NAND strings approximate the actual deterioration of the memory cells of the selected page. The controller 140 can detect the current by selecting either one part of monitoring NAND strings or the other parts of monitoring NAND strings according to user settings or the like. Alternatively, the controller 140 detects the currents of both of the one part of the monitoring NAND strings and the other parts of monitoring NAND strings, compares the average value with the reference current IREF, and determines the offset voltage Vofs1/Vofs2.

Next, a second embodiment of the present disclosure is described. In the above embodiment, the page buffering/sensing circuit 170 uses a voltage detection method for detecting the voltage of the bit line, while in the second embodiment, the data "0" and "1" of the memory cell are determined by using the current detection method that detects the current flowing through the bit line. As shown in FIG. 5, although the voltage detection method precharges the bit line and then discharges the precharged voltage, since the current detection method only needs to sense the current flowing through the bit line, the current detection method does not require the steps of precharging and discharging.

For example, the sensing circuit of the current detection method converts the current into a voltage by a cascade circuit to determine the data "0" and "1" of the memory cell, or compares the current flowing through the NAND string with the reference current to determine the data "0" and "1" of the memory cell. When using a sensing circuit of the voltage detection method, in order to suppress noise by capacitive coupling between bit lines, shield reading is generally performed in which one part of even-numbered bit lines and odd-numbered bit lines is selected and the other is set to GND, while the sensing circuit of the current detection method can read all bit lines at the same time.

Figure 6:
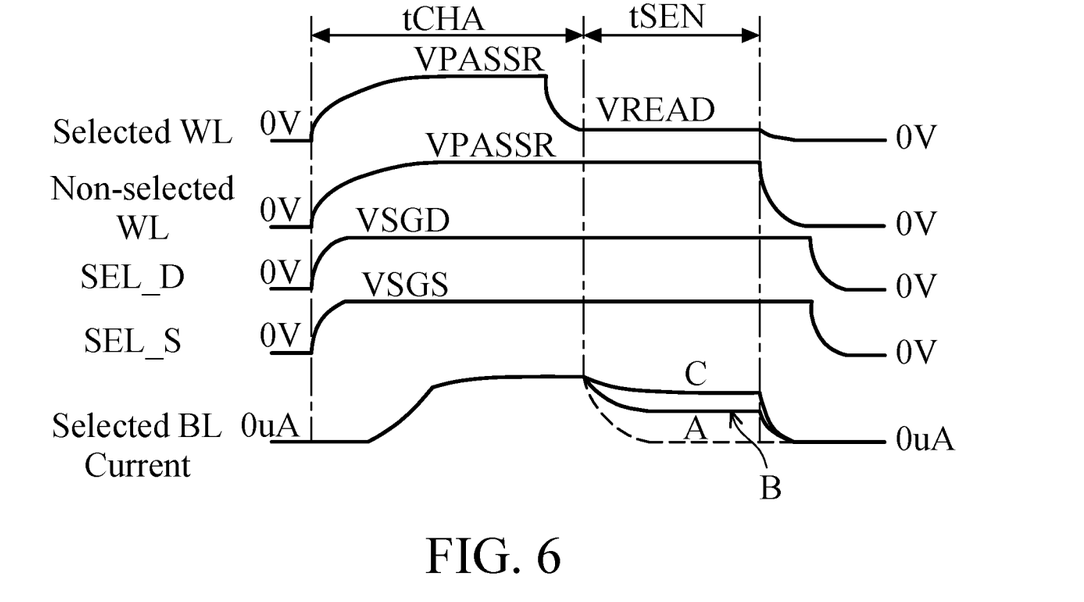
FIG. 6 shows a timing chart explaining the read operation of the flash memory according to the conventional current sensing method.

FIG. 6 is a timing chart explaining the read operation using the conventional current detection method. In the charging period tCHA, the read-pass voltage VPASSR is applied to the selected word line and the non-selected word line, the selected transistor SEL_D at the bit line side is turned on by the gate voltage VSGD, and the selected transistor SEL_S at the source line side is turned on by the gate voltage VSGS. The page buffering/sensing circuit 170 transmits current to the bit lines and the NAND strings in the selected block.

Next, in the sensing period tSEN, a reading voltage VREAD (for example, 0.2 V) is applied to the selected word line. When the selected memory cell is in the programmed state, the current flowing through the bit line is at the GND level because the NAND string is non-conducting, and when the selected memory cell is in the erased state, a constant current flows through the bit line because the NAND string is conductive. Here, the broken line A indicates the current of the bit line when the selected memory cell is programmed, and the solid lines B and C indicate the current of the bit line when the selected memory cell is erased. The solid line B has a large number of program/erase cycles, and the Gm of the memory cell deteriorates, so that the current of the bit line decreases. The solid line C has a small number of program/erase cycles (including no cycle), the deterioration of Gm of the memory cell is small, and the current of the bit line is large. In the case of solid line B, the difference in the reading margin from broken line A becomes small, which may lead to a mistaken determination of the read data of the memory cell.

Figure 7:
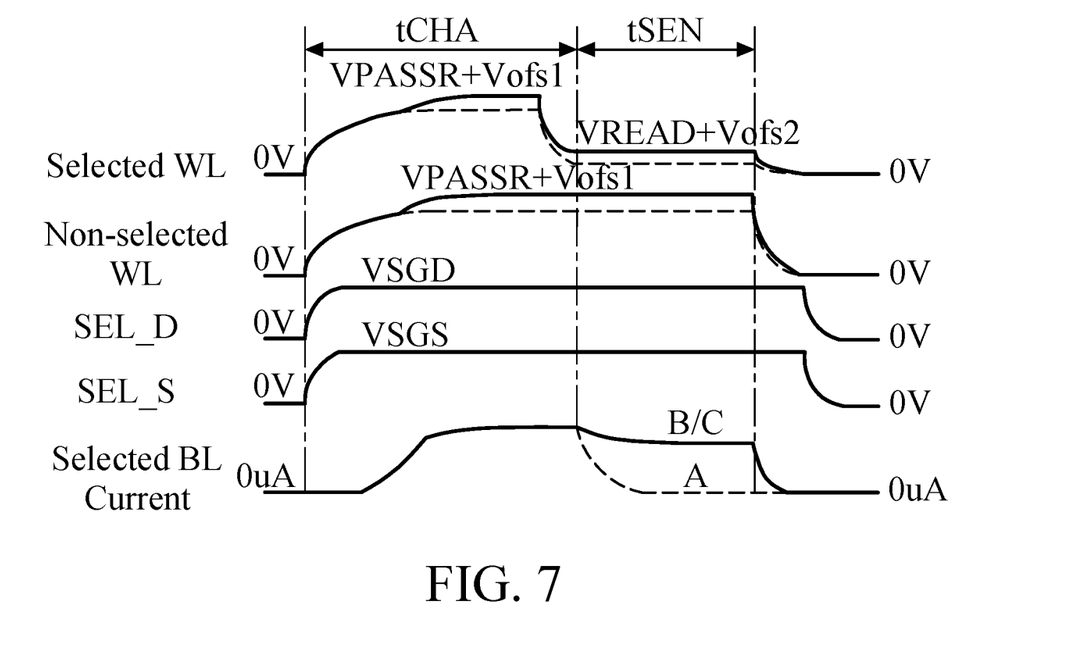
FIG. 7 shows a timing chart explaining the read operation of the flash memory by the current sensing method according to another example of the present disclosure.

FIG. 7 is a timing chart illustrating a read operation of the current detection method according to the second embodiment. In this embodiment, the current flowing through the monitoring NAND string MS is detected during the charge period tCHA, and the offset voltage Vofs1/Vofs2 determined based on the detection result is applied to the read-pass voltage VPASSR and the reading voltage VREAD in almost real time. As a result, in the sensing period tSEN, the current (solid line B) of the bit line including the memory cells in the erased state having a large number of program/erase cycles is approximately equal to the current (solid line C) of the bit line including the memory cells in the erased state with a small number of program/erase cycles (including no cycle). Therefore, it is possible to maintain a constant reading margin with respect to the current (broken line A) of the bit line including the memory cell in the program state, and to prevent a mistaken determination of the read data of the memory cell.

Although the preferred embodiments of the present disclosure have been described in detail, the present disclosure is not limited to the specific embodiments, and various modifications or alternatives can be made within the scope of the spirit of the present disclosure described in the claims.

What is claimed is:

1. A reading method of a semiconductor memory device, comprising:
   performing a first step to prepare at least one monitoring NAND string for each block of a NAND memory cell array, wherein the monitoring NAND string is used to monitor the cycle frequency of programing and erasing;
   performing a second step to detect a current that flows through the monitoring NAND string;
   performing a third step to determine a first offset voltage and a second offset voltage that are respectively added to a read-pass voltage and a reading voltage according to the detected current; and
   performing a fourth step to apply the read-pass voltage with the first offset voltage added to non-selected word lines, and to apply the reading voltage with the second offset voltage added to selected word lines, in response to reading the cell memory array.

2. The reading method of a semiconductor memory device as claimed in claim 1, wherein performing the first step further comprises programing the monitoring NAND string when erasing the block.

3. The reading method of a semiconductor memory device as claimed in claim 2, wherein all of the memory cells of the monitoring NAND string are programmed at once.

4. The reading method of a semiconductor memory device as claimed in claim 1, wherein performing the first step further comprises programing the memory cell corresponding to the NAND string when a selected page of the memory cell array is programmed.

5. The reading method of a semiconductor memory device as claimed in claim 4, wherein the monitoring NAND string is programmed by a weaker programming than that for programming a page of user-using area of the memory cell array.

6. The reading method of a semiconductor memory device as claimed in claim 1, wherein the second step is performed while the memory cell array is being read.

7. The reading method of a semiconductor memory device as claimed in claim 6, wherein the second step is performed during a bit line precharge period.

8. The reading method of a semiconductor memory device as claimed in claim 7, wherein performing the second step further comprises bringing the monitoring NAND string into a conductive state by turning on selected transistors on the source line side for only a certain period during the bit line precharge period, and detecting the current that flows through the monitoring NAND string at least when applying a precharge voltage to the bit line connected to the monitoring NAND string.

9. The reading method of a semiconductor memory device as claimed in claim 1, wherein performing the second step further comprises storing information about the detected current in transistors, and performing the third step further comprises determining the first offset voltage and the second offset voltage according to the information read from the transistors.

10. The reading method of a semiconductor memory device as claimed in claim 1, wherein performing the third step further comprises determining the first offset voltage and the second offset voltage according to the difference between the current detected in the second step and a reference current.

11. The reading method of a semiconductor memory device as claimed in claim 1, wherein the monitoring NAND string is prepared in an area of a memory cell array that is not used by a user or in an area of the memory cell array that cannot be accessed by the user.

12. A semiconductor memory device, comprising:
   a NAND memory cell array, comprising a plurality of blocks, each of which is formed with at least one monitoring NAND string to monitor the cycle frequency of programing and erasing;
   a current detecting device, detecting current that flows through the monitoring NAND string;
   a determining device, determining a first offset voltage and a second offset voltage that are respectively added to a read-pass voltage and a reading voltage according to the current detected by the current detecting device; and
   a reading device, reading a page of the memory cell array;
   the reading device applying the read-pass voltage to which the first offset voltage is added to non-selected word lines, and applying the reading voltage to which the second offset voltage is added to selected word lines.

13. The semiconductor memory device as claimed in claim 12, wherein the semiconductor memory device further comprises a programming device, programming all of the memory cells of the monitoring NAND string at once when erasing the block.

14. The semiconductor memory device as claimed in claim 12, wherein the semiconductor memory device further comprises a programming device, programming memory cells corresponding to the monitoring NAND string when programming the selected page of the memory cell array.

15. The semiconductor memory device as claimed in claim 13 wherein the programming device is a weaker programming than that for programming a page of user-using area of the memory cell array.

16. The semiconductor memory device as claimed in claim 14, wherein the programming device is a weaker programming than that for programming a page of user-using area of the memory cell array.

17. The semiconductor memory device as claimed in claim 12, wherein the current detecting device detects current when the reading device performs a read operation.

18. The semiconductor memory device as claimed in claim 17, wherein the current detecting device further comprises bringing the monitoring NAND string into a conductive state by turning on selected transistors on the source line side for only a certain period, during the bit line precharge period, and detecting the current that flows through the monitoring NAND string at least when applying a precharge voltage to the bit line connected to the monitoring NAND string.

19. The semiconductor memory device as claimed in claim 12, wherein the current detecting device stores information about the detected current in transistors, and the determining device determines the first offset voltage and the second offset voltage according to the information read from the transistors.

20. The semiconductor memory device as claimed in claim 12, wherein the determining device determines the first offset voltage and the second offset voltage according to a comparison result from a comparing device, wherein the comparing device calculates the difference between the current detected by the current detecting device and a reference current.

\* \* \* \* \*